US012771303B2

(12) United States Patent
Cherif et al.

(10) Patent No.: US 12,771,303 B2
(45) Date of Patent: Oct. 20, 2026

(54) DYNAMIC CURRENT MIRROR EMPLOYING MILLER EFFECT

(71) Applicant: Northrop Grumman Systems Corporation, Falls Church, VA (US)

(72) Inventors: Bouchaib Cherif, Yorktown Heights, NY (US); Philippe O. Pouliquen, Baltimore, MD (US); Jamal Lottier Molin, Odenton, MD (US); Sergio Tudor Montano, McLean, VA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 427 days.

(21) Appl. No.: 18/431,040

(22) Filed: Feb. 2, 2024

(65) Prior Publication Data

US 2025/0253816 A1 Aug. 7, 2025

(51) Int. Cl.
*H03F 3/45* (2006.01)
*H03F 1/02* (2006.01)
*H03F 1/34* (2006.01)

(52) U.S. Cl.
CPC ....... *H03F 3/45273* (2013.01); *H03F 1/0211* (2013.01); *H03F 1/342* (2013.01)

(58) Field of Classification Search
CPC . H03F 1/305; H03F 1/12; H03F 1/025; H03F 1/0255
See application file for complete search history.

(56) References Cited

U.S. PATENT DOCUMENTS 6,788,146 B2 9/2004 Forejt et al.
6,812,778 B1 11/2004 Yeo et al.
8,121,495 B2 2/2012 Tourette
9,552,851 B2 * 1/2017 Fritsch .................. G11C 5/063
2003/0122617 A1 7/2003 Johnston
2012/0019324 A1 * 1/2012 Kumar ................ H03F 3/45928 330/261
2020/0160901 A1 * 5/2020 Boujamaa ............ G11C 27/026

OTHER PUBLICATIONS

Lundberg, Origin of the Miller Effect, 2022, 22 Pages. Retrieved from webpage: https://www.mit.edu/~klund/papers/jmiller.pdf.
Wegmann et al., Analysis and Improvements of Accurate Dynamic Current Mirrors, IEEE Journal of Solid-State Circuits, vol. 25, Issue 3, Jun. 1990, 699-706. (Abstract Only) https://ieeexplore.ieee.org/abstract/document/102663.
Wegmann, Design and Analysis Techniques for Dynamic Current Mirrors, Scientific Production and Competences, Ecole Polytechnique Federale de Lausanne, These No. 890, 1990, 198 pages. (SPLIT into A & B) https://doi.org/10.5075/epfl-thesis-890.

* cited by examiner

*Primary Examiner* — Henry Choe
(74) *Attorney, Agent, or Firm* — Dority & Manning, P.A.

(57) ABSTRACT

According to aspects of the present disclosure, a dynamic current mirror (DCM) is operated in a first stage and a second stage that is temporally subsequent to the first stage. The DCM includes a current memory cell and an inverting voltage amplifier. During the first stage, the current memory cell receives an input current and stores a corresponding voltage via a capacitance of the current memory cell. During the second stage, the current memory cell employs the stored input voltage to drive an output current that matches the input current. The inverting voltage amplifier is employed to increase the capacitance of the current memory cell via a Miller-effect amplification of the capacitance.

18 Claims, 4 Drawing Sheets

DYNAMIC CURRENT MIRROR EMPLOYING MILLER EFFECT

FIELD

The present disclosure relates generally to current mirrors, and more particularly to dynamic current mirrors that employ a Miller-effect amplification of a capacitance of the dynamic current mirror.

BACKGROUND

A current mirror is an electrical circuit designed to copy an electrical current through one active device by controlling the current in another active device of a circuit, keeping the output current constant regardless of loading. The current being "copied" can be, and sometimes is, a time-varying current signal. Conceptually, an ideal current mirror is an ideal inverting current amplifier that reverses the current direction as well. A current mirror may be used to provide bias currents under active loads to circuits. Current mirrors can also be used to model a more realistic current source.

Traditional current mirrors include two transistors (e.g., an input transistor that receives the input current signal and an output transistor that regulates the output current). The design of these traditional current mirrors requires a precise matching in the sizes of the two transistors for a corresponding precise matching between the input and output currents. An asymmetry in the size or other characteristics of the two transistors degrades the performance of a traditional current mirror. Many MOS fabrication processes introduce unintentional variation across an integrated chip. Thus, employing a current mirror that is integrated on a larger chip may not be feasible for some applications. Transistor matching is also dependent on transistor size, so in some cases, achieving the desired performance may require too much area on an integrated chip. Furthermore, traditional current mirrors are continuous time circuits, and therefore cannot be used to sample-and-hold a signal, such as might be required for analog-to-digital conversion or to delay a signal.

BRIEF DESCRIPTION

Aspects and advantages of the present disclosure will be set forth in part in the following description, or may be obvious from the description, or may be learned through practice of the present disclosure.

According to some aspects of the present disclosure, an electrical circuit is operated in a first operational stage and a second operational stage that is temporally subsequent to the first operational stage. During the first operational stage, the circuit is configured to transmit an input signal into a first element. The input signal includes an input current. During the second operational stage, the circuit is configured to drive a transmission of an output signal out of the first element. The output signal includes an output current. The circuit comprises an inverting amplifier. The inverting amplifier is configured to invert and amplify an input voltage associated with the input signal such that a capacitance of a feedback capacitive element of the circuit is increased via a Miller-effect amplification. The Miller-effect amplification is enabled by the capacitive element capacitively coupling an output terminal and an input terminal of the inverting amplifier. During the first operational stage, the cell capacitance is configured to store the input voltage. The cell capacitance is the combination of the capacitance of the Miller-effect amplified feedback capacitive element and other capacitances that may also be present in the circuit. The cell capacitance is increased via the Miller-effect amplification of the capacitance of the feedback capacitive element. During the second operational stage, the cell capacitance is configured to provide the stored input voltage to drive the transmission of the output signal such that the output current matches the input current.

According to some other aspects of the present disclosure, an electrical circuit is operated in a first operational stage and a second operational stage that is temporally subsequent to the first stage. The circuit includes an input-signal line, an output-signal line, and a current memory cell. The current memory cell comprises an inverting amplifier. During the first operational stage, the input-signal line is configured to transmit an input signal that has an input current. During the second operational stage, the output-signal line is configured to transmit an output signal that has an output current. During the first operational stage, the current memory cell is configured to receive the input. Additionally, during the first operational stage, a cell capacitance of the current memory cell is charged to store an input voltage associated with the input signal. During the second operational stage, the current memory cell is configured to employ the input voltage stored by the cell capacitance to output the output signal such that the output current matches the input current. The inverting amplifier is configured to increase the cell capacitance via a Miller-effect amplification that includes inverting and amplifying the input voltage.

According to still other aspects of the present disclosure, a dynamic current mirror (DCM) is operated in a first operational stage and a second operational stage that is temporally subsequent to the first stage. The DCM includes a current memory cell and an inverting voltage amplifier. During the first operational stage, the current memory cell receives an input current and stores a corresponding voltage via a capacitance of the current memory cell. During the second operational stage, the current memory cell employs the stored input voltage to drive an output current that matches the input current. The inverting voltage amplifier is employed to increase the capacitance of the current memory cell via a Miller-effect amplification of at least a portion of the capacitance.

These and other features, aspects, and advantages of the present disclosure will be further supported and described with reference to the following description and appended claims. The accompanying drawings, which are incorporated in and constitute a part of this specification, illustrate embodiments of the disclosure and, together with the description, serve to explain the principles of the disclosure.

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which.

Figure 1A:
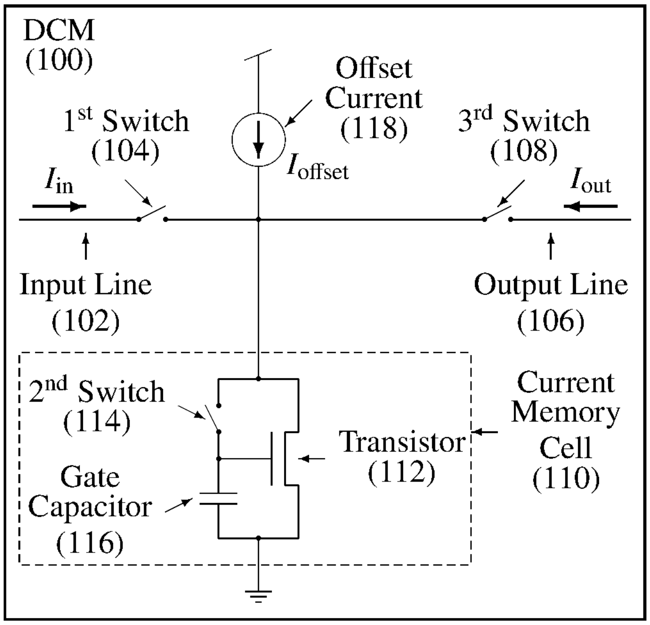
FIG. 1A shows one embodiment of a dynamic current mirror.

Repeat use of reference characters in the present specification and drawings is intended to represent the same or analogous features or elements of the present technology.

DETAILED DESCRIPTION

Reference now will be made in detail to embodiments of the disclosure, one or more examples of which are illustrated in the drawings. Each example is provided by way of explanation of the disclosure, not limitation of the disclosure. In fact, it will be apparent to those skilled in the art that various modifications and variations can be made in the present disclosure without departing from the scope or spirit of the disclosure. For instance, features illustrated or described as part can be used with another embodiment to yield a still further embodiment. Thus, it is intended that the present disclosure covers such modifications and variations as come within the scope of the appended claims and their equivalents.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Approximating language, as used herein throughout the specification and claims, is applied to modify any quantitative representation that could permissibly vary without resulting in a change in the basic function to which it is related. Accordingly, a value modified by a term or terms, such as "about," "approximately," "generally," and "substantially," is not to be limited to the precise value specified. In at least some instances, the approximating language may correspond to the precision of an instrument for measuring the value, or the precision of the methods or apparatus for constructing or manufacturing the components and/or systems. For example, the approximating language may refer to being within a ten percent margin.

Moreover, the technology of the present application will be described in relation to exemplary embodiments. The word "exemplary" is used herein to mean "serving as an example, instance, or illustration." Any embodiment described herein as "exemplary" is not necessarily to be construed as preferred or advantageous over other embodiments. Additionally, unless specifically identified otherwise, all embodiments described herein will be considered exemplary.

As used herein, the term "and/or," when used in a list of two or more items, means that any one of the listed items can be employed by itself, or any combination of two or more of the listed items can be employed. For example, if a composition or assembly is described as containing components A, B, and/or C, the composition or assembly can contain A alone; B alone; C alone; A and B in combination; A and C in combination; B and C in combination; or A, B, and C in combination.

In general, examples of the present subject matter are directed to designs and architectures for dynamic current mirrors. Dynamic current mirrors (DCMs) of the embodiments, are contrasted with traditional current mirrors, which require an input transistor that must match an output transistor. The DCMs of the embodiments overcome various shortcomings of traditional current mirrors, at least because the DCMs of the embodiments employ a single transistor, rather than the pair of transistors (e.g., the input transistor and the output transistor) for the current mirror effect. That is, in order to match input and output currents, multiple transistors need not be "matched" in the various embodiments. Accordingly, the DCMs of the embodiments do not suffer performance degradation due to variations of transistor characteristics across an integrated chip. Accordingly, the DCMs of the embodiments may be integrated into a larger chip or used with a fabrication process with more transistor characteristics variations.

The DCMs of the embodiments may include a current memory cell that includes a transistor and a capacitor. The transistor may be a field effect transistor (FET) and thus have a gate terminal, a source terminal, and a drain terminal. However, other transistors or combinations thereof may be used without deviating from the scope of the present disclosure. For instance, a bipolar junction transistor (BJT) may be used in some of the embodiments. Darlington transistor configurations as well as other multi-transistor configurations may also be used in some of the embodiments. In addition to the memory cell, a DCM may include an input line and an output line. A first terminal of the capacitor may be tied to the transistor's gate terminal, and thus the capacitor may be referred to as a gate capacitor (or a gate terminal capacitor). A second terminal of the gate capacitor may be tied to ground or another fixed voltage source. A DCM may be operated in two operational stages. In the first operational stage, an input signal is provided to the transistor's drain terminal via a closed first switch tying the input line to the transistor's drain terminal. The transistor's source terminal may be connected to ground or another fixed voltage source. The input signal may include an input current. The transistor's gate terminal may be connected to the transistor's drain terminal via a closed second switch. Thus, during the first operational stage, the gate capacitor may be charged (via an input voltage associated with the input signal), and thus store a voltage corresponding to the input current (e.g., the input voltage associated with the input signal). During the second operational stage, the first and second switches are opened, and a third switch is closed. The closed third switch connects the transistor's drain terminal to the output line. The charged gate capacitor provides the stored voltage (e.g., the gate voltage) to the transistor's gate terminal. Via the closed third switch and the charged gate capacitor, the transistor provides an output current that "mirrors" or "matches" the input current to the output line. In some embodiments, the footprint of the gate capacitor may be fabricated to be relatively large to compensate for various parasitic capacitances and sources of leakage, such as the switches (which themselves may be transistors). In some embodiments, additional optional stages may be inserted between the first and second operational stages to guard against potential overlap in the operation of the switches. Unintentional undesirable overlap in the operation of the switches can occur when two or more switches are opened and/or closed simultaneously.

To avoid large gate capacitors, some embodiments may take advantage of the Miller effect and/or employ a Miller amplifier. The Miller effect generates an apparent (or effective) increase in the capacitance at one terminal of a capacitor when the other terminal of the capacitor is driven by an amplifier to a related (e.g., an inverted and amplified) voltage. The amplifier may be an inverting voltage amplifier. In other words, the Miller effect accounts for an increase in the equivalent input capacitance of an inverting amplifier due to the amplification effect of the capacitance between the input and output terminals of the amplifier. For instance, by definition, a 1 Farad (F) capacitor will store 1 Coulomb (C) of charge when the potential difference between the capacitor's two terminals is 1 Volt (V). In other words, a 1 F capacitor requires 1 C of charge to raise the voltage of its first terminal by 1 V when the voltage on the capacitor's second terminal remains fixed. However, rather than remaining at a fixed voltage, if the capacitor's second terminal is driven by an output voltage of an inverting voltage amplifier of a gain of −1, then as the first terminal's voltage rises, the second terminal's voltage will decrease (due to the voltage inversion), so that the overall potential difference across the capacitor will be twice the voltage of the capacitor's first terminal. Therefore, for the 1 F capacitor, 2 C of charge is required to raise the first terminal voltage by 1 V. That is, when driven by an inverting voltage amplifier, the capacitor's "effective" capacitance is amplified, multiplied, or otherwise increased by a factor of 2. If an inverting amplifier with a stronger gain is used, the multiplicative factor for the increased "Miller's capacitance" may be increased further.

A Miller amplifier, as used by the embodiments, may be an inverting voltage amplifier, where the input and output terminals are capacitively coupled with a capacitance (or a complex impedance). Due to the Miller effect, the input capacitance of the amplifier may be "amplified" (or virtually increased). The "Miller capacitance" of the amplifier may be used in the storage cell to increase the capacitance of the current memory cell, such that the size of the gate capacitor may not need to be increased to account for the parasitic capacitances and sources of leakage in the DCM.

In some embodiments, the Miller amplifier may be an inverting amplifier of any practical design. The input range of the Miller amplifier may be tuned to match the expected range of the transistor's gate terminal voltage. The amplifier's output range may be tuned to absorb the expected disturbances (e.g., leakage, charge injection, and capacitive coupling). However, in some applications of a DCM of the embodiments, the transistor's gate voltage may exceed the input range of an inverting amplifier. If reducing the amplifier's gain to increase its input range is not feasible, then a dynamic amplifier may be used in some embodiments.

In embodiments where a dynamic inverting amplifier is used for the Miller amplifier, the amplifier also operates in two operational stages. In the first operational stage, the dynamic (inverting) amplifier adapts to the current gate terminal voltage of the transistor, so that the amplifier's input range is adapted to the gate terminal voltage. During the second operational stage, the Miller amplifier operates to amplify any disturbances in the gate terminal voltage. In some embodiments, additional optional stages may be inserted between the first and second operational stages to guard against potential overlap in the operation of the switches. In these embodiments, the Miller amplifier may be employed for scenarios where the range of input currents are large. The dynamic Miller amplifier is particularly well suited to a DCM, where large input current ranges are expected, at least because the range of gate terminal voltages may be relatively narrow, so large gains can be employed. The dynamic Miller amplifier also has low gain during the first operational stage, so that the Miller capacitance amplification is reduced when the capacitance is being charged, which can result in faster settling time in comparison to a conventional DCM with equivalent gate capacitance.

Figure 1B:
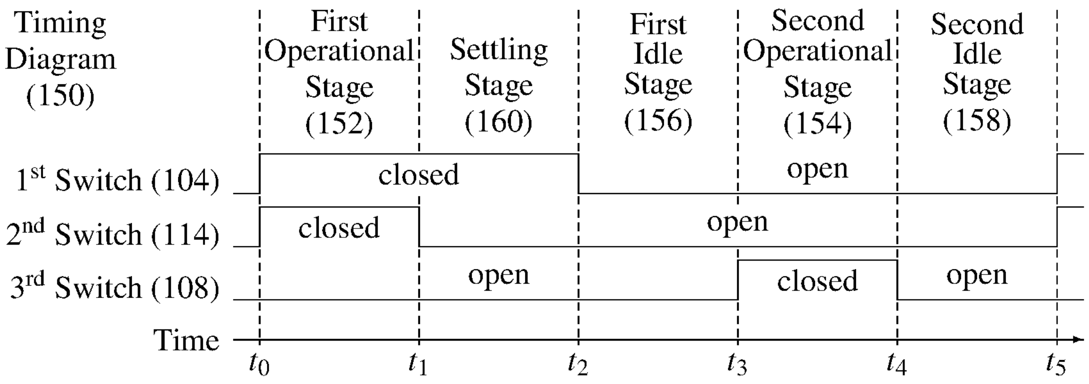
FIG. 1B shows the timing diagram of the operational stages of the dynamic current mirror of FIG. 1A.

Referring now to FIGS. 1A-1B, FIG. 1A shows one embodiment of a dynamic current mirror (DCM) 100, and FIG. 1B shows the timing diagram 150 of the operational stages of the dynamic current mirror 100. DCM 100 has an input line 102, an optional offset current 118, and an output line 106. DCM 100 also has a current memory cell 110. The input line 102 is tied to the current memory cell 110 through a first switch 104. The output line 106 is tied to the current memory cell 110 through a third switch 108. The optional offset current 118 provides an offset current (e.g., $I_{offset}$) to the current memory cell 110 to shift the gate voltage of the current memory cell 110 if needed. The current memory cell 110 includes a transistor 112, a second switch 114, and a gate capacitor 116.

Through the first switch 104, the transistor's 112 drain terminal is connected to the input line 102. Through the third switch 108, the transistor's 112 drain terminal is connected to the output line 106. Through the second switch 114, the transistor's 112 gate terminal is connected to the transistor's 112 drain terminal. The first terminal of the gate capacitor 116 is tied to the transistor's 112 gate terminal. The second terminal of the gate capacitor 116, as well as the transistor's 112 source terminal, are tied to ground or another fixed voltage.

As shown in FIG. 1B, during the first operational stage 152, the first switch 104 and the second switch 114 are closed, and the third switch 108 is opened. An input current (e.g., $I_{in}$) is provided to the current memory cell 110, via the input line 102 and the closed first switch 104. During the first operational stage 152, the input current is "measured" and "stored" in the current memory cell 110. More particularly, because the second switch 114 is closed, the gate capacitor 116 is charged to a voltage corresponding to the input current. Because the transistor's 112 gate terminal is tied to the transistor's 112 drain terminal during the first operational stage 152, and the input line 102 is tied to the transistor's 112 drain terminal, the input current is added to the optional offset current 118 and flows into the transistor's 112 drain terminal and out the transistor's 112 source terminal.

As shown in FIG. 1B, during the second operational stage 154, the first switch 104 and the second switch 114 are opened, and the third switch 108 is closed. Thus, the transistor's 112 gate terminal is switched from the "outside world" to the "inside world." The voltage stored on the gate capacitor 116 is provided to the transistor's 112 gate terminal, and a drain current flows into transistor's 112 drain terminal. The optional offset current 118 is now subtracted from the transistor's 112 drain current. Thus an output current (e.g., $I_{out}$) flows from the output line 106 to ground. The output current of the second operational stage 154 "matches" or "mirrors" the input current of the first operational stage 152.

In some embodiments of DCM 100, additional optional stages may be inserted between the first and second operational stages to avoid toggling two or more switches simultaneously. As shown in FIG. 1B, an optional additional first idle stage 156 is inserted between the first operational stage 152 and the second operational stage 154. The first idle stage 156 helps to guard against the first switch 104 and the third switch 108 being closed simultaneously, which is undesirable as it would connect the input line 102 to the output line 106, shorting the output to the input. Similarly, an optional additional second idle stage 158 is inserted between the second operational stage 154 and the following first operational stage 152, to help guard against the first switch 104 and the third switch 108 being closed simultaneously. An optional additional settling stage 160 is also shown inserted immediately after the first operational stage 152. The optional additional settling stage 160 is used to avoid the first switch 104 opening before the second switch 114. If the first switch 104 opens before the second switch 114, then the current flowing into the current memory cell 110 from the input line would cease, which could cause the gate capacitor 116 to discharge, resulting in the wrong current being stored.

In the DCM 100 embodiment shown in FIG. 1A, the switches may be implemented via transistors, with non-zero switch times. The transistors implementing the switches (as well as transistor 112) may be somewhat "leaky," and thus conduct at least some current when open, and limit the gate capacitor's 116 ability to store the voltage. Therefore the voltage cannot be stored on the gate capacitor 116 indefinitely. Also, the transistor-implemented switches (as well as transistor 112) may have parasitic capacitances. To compensate for the non-idealities of the switches (as well as transistor 112), the gate capacitor 116 may be fabricated to have a larger capacitance. However, increasing the capacitance of the gate capacitor 116 may take up a significant amount of area on the chip.

In order to reduce the physical footprint of a gate capacitor, in some of the embodiments, a Miller amplifier may be employed to increase the gate capacitance. A Miller amplifier, as used by the embodiments, may be an inverting amplifier, where the input and output terminals are tied together with a capacitance (or a complex impedance). The Miller effect accounts for an increase in the equivalent input capacitance of an inverting amplifier due to the amplification effect of the capacitance between the input and output terminals of the amplifier. Due to the Miller effect, the input capacitance of the amplifier may be "amplified" (or virtually increased). The "Miller capacitance" of the amplifier may be used in the storage cell to increase the capacitance of the current memory cell, such that the size of the gate capacitor may not need to be increased as much to account for the parasitic capacitances and sources of leakage in the DCM.

Figure 2A:
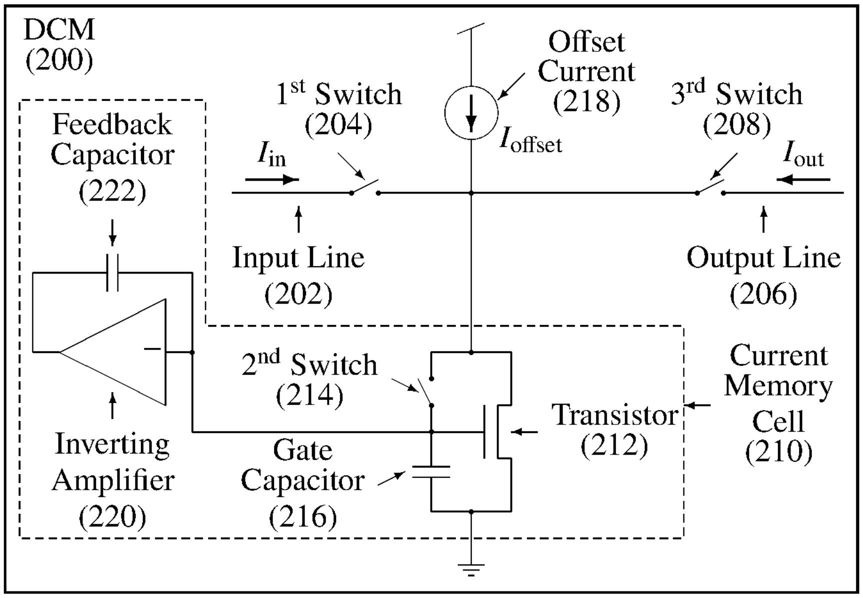
FIG. 2A shows a second embodiment of a dynamic current mirror that employs an inverting amplifier.
Figure 2B:
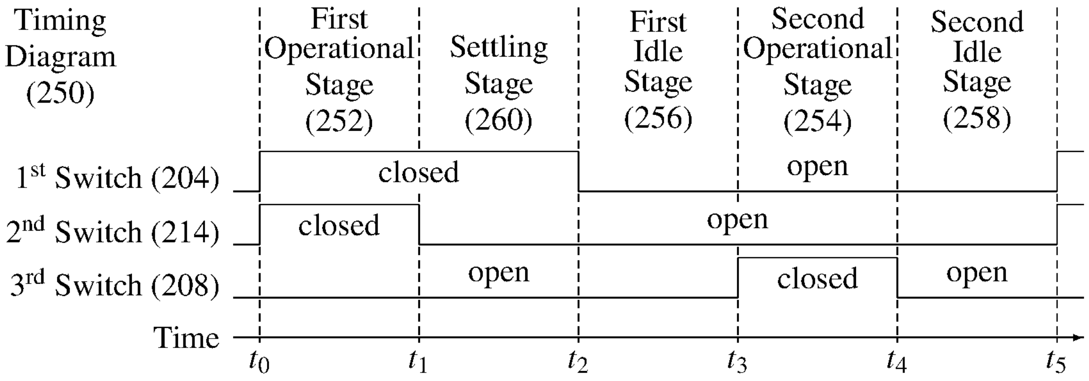
FIG. 2B shows the timing diagram for the operational stages of the dynamic current mirror of FIG. 2A.

Referring now to FIGS. 2A-2B, FIG. 2A shows another embodiment of a dynamic current mirror (DCM) 200, and FIG. 2B shows the timing diagram 250 of the operational stages of DCM 200. The DCM 200 employs an inverting amplifier 220, arranged in a Miller amplifier configuration. The use of the inverting amplifier 220 enables a reduction of the required capacitance of a gate capacitor 216, by adding a capacitance 222 which is itself multiplied via the Miller effect. Thus, embodiments similar to DCM 200 may be referred to as Miller-effect DCMs. Similar to DCM 100 of FIG. 1A, DCM 200 has an input line 202, an optional offset current 218, and an output line 206. Also similar to DCM 100, DCM 200 has a current memory cell 210. The input line 202 of DCM 200 is tied to the current memory cell 210 through a first switch 204. The output line 206 is tied to the current memory cell 210 through a third switch 208. The optional offset current 218 provides an offset current (e.g., $I_{offset}$) to the current memory cell 210 to shift the gate voltage of the current memory cell 210 if needed. Similar to current memory cell 110 of FIG. 1A, the current memory cell 210 includes a transistor 212, a second switch 214, and a gate capacitor 216. In contrast to current memory cell 110, current memory cell 210 additionally includes an inverting amplifier 220 and a feedback capacitor 222.

In some embodiments, transistor 212 may be a field effect transistor (FET). Thus, transistor 212 may have a drain terminal, a source terminal, and a gate terminal. The DCM 200 may be fabricated on a metal-oxide-semiconductor (MOS) process. Thus, the transistor 212 may be a MOSFET. The DCM 200 may be fabricated on a complementary metal-oxide-semiconductor (CMOS) process. In some embodiments, the transistor 212 is a P-MOS FET, while in other embodiments, the transistor 212 is an N-MOS FET. In the various embodiments, the transistor 212 is employed as a transconductance element, where current flowing between the drain terminal and the source terminal is regulated by the voltage difference between the gate terminal and the source terminal (e.g., $V_{GS}$) and the voltage difference between the drain terminal and the source terminal (e.g., $V_{DS}$). In some embodiments, no current may flow between the source and drain terminals unless $V_{GS} \geq V_{TH}$ for N-MOS FET (or $V_{GS} \leq V_{TH}$ for P-MOS FET), where $V_{TH}$ is a threshold voltage, depending on the design of transistor 212. In some embodiments, transistor 212 may have a "subthreshold region" where a small amount of current flows between the source and drain terminals even for $V_{GS} < V_{TH}$ for N-MOS FET (or $V_{GS} > V_{TH}$ for P-MOS FET). Because a FET may be employed as a digital switch or gate, the first switch 204, the second switch 214, and the third switch 208 may be implemented by transistors (e.g., FETs).

Through the first switch 204, the transistor's 212 drain terminal is connected to the input line 202. Through the third switch 208, the transistor's 212 drain terminal is connected to the output line 206. Through the second switch 214, the transistor's 212 gate terminal is connected to the transistor's 212 drain terminal. The first terminal of the gate capacitor 216 is tied to the transistor's 212 gate terminal. The second terminal of the gate capacitor 216, as well as the transistor's 212 source terminal, are tied to ground or another fixed voltage.

The inverting amplifier 220 may be a voltage amplifier that inverts (and amplifies) a voltage that is provided as an input. An input voltage is provided to an input terminal of the inverting amplifier 220, and an output terminal of the inverting amplifier is provided with an output voltage that is an inverted and amplified modulation of the input voltage. If −A represents the amplification of the inverting amplifier and $V_i$ represents that input voltage, then the output voltage (e.g., $V_o$) is calculated by $V_o = -A \cdot V_i + V_{off}$ (where $V_{off}$ is the output offset voltage of the inverting amplifier). In various embodiments, $A \geq 1$. The inverting amplifier 220 has a feedback capacitance 222 between its input and output terminals. In some embodiments, the feedback capacitor 222 represents the parasitic feedback capacitance of the inverting amplifier 220. In other embodiments, the feedback capacitor 222 is a physical capacitor that is added between the input terminal and output terminal of the inverting amplifier 220.

The Miller effect increases the apparent (or effective) capacitance of the feedback capacitor 222 and/or the effective input capacitance of the inverting amplifier 220 due to the inversion and amplification of the input voltage. Note that the voltage difference between the two terminals of the feedback capacitor 222 is the difference between the input voltage and the output voltage of the inverting amplifier. Thus, the voltage difference across the terminals of the feedback capacitor 222 is increased due to the inversion and amplification of the input voltage. This provides an "effective" increase to the capacitance of the feedback capacitor 222 and/or the input capacitance of the inverting amplifier 220. If the capacitance of the feedback capacitor 222 is represented by $C_0$, then the effective (e.g., increased or amplified) capacitance of the feedback capacitor 222 is represented by $C_{eff}=C_0\cdot(1+A)$. The increase of the input capacitance of the inverting amplifier 220 is referred to as the Miller effect. The arrangement of the inverting amplifier 220 and the capacitance (e.g., the feedback capacitor 222 between the input and output terminals of the inverting amplifier 220 may be referred to as a Miller amplifier. Throughout, the feedback capacitor 222 represents various capacitances between the input and output terminals of the inverting amplifier 220, including, but not limited to the parasitic feedback capacitance of the inverting amplifier 220.

As discussed below, due to the apparent increase (e.g., amplification) of the capacitance between the terminals of the inverting amplifier 220, the capacitance of the gate capacitor 216 may be significantly decreased. This may result in a significant reduction is the physical size (e.g., the footprint) of the gate capacitor 216, when integrated onto a chip (e.g., a CMOS chip).

Note that the current memory cell 220 has a total cell capacitance that includes at least the combination of the gate capacitor 216 and the feedback capacitor 222, which have a common terminal such that their capacitive effects are additive. As noted above, the feedback capacitor 222 represents the total capacitance between the input and output terminals of the inverting amplifier 220. Thus, the total cell capacitance is greater than either the capacitance of the gate capacitor 216 or the capacitance of the feedback capacitor 222. In some embodiments, the total cell capacitance is equal to or greater than the sum of the capacitance of the gate capacitor 216 and the capacitance of the feedback capacitor 222. The total cell capacitance may be greater than the sum of the capacitance of the gate capacitor 216 and the capacitance of the feedback capacitor 222, due to other inherent and/or parasitic capacitances of the elements of the DCM 200. For example, the inverting amplifier 220 has an input capacitance. As noted above, the capacitance of the feedback capacitor 222 may be significantly increased due to the Miller effect. Because the total cell capacitance is equal to or greater than the sum of the capacitance of the feedback capacitor 222 and the capacitance of the gate capacitor 216, the total cell capacitance of the current memory cell 210 is significantly increase due to the Miller effect. As such, for a given amount of desired capacitance of the current memory cell 210, the capacitance (and thus the physical footprint) of the gate capacitor 216 may be significantly reduced for DCM 200. Note that in some embodiments, an explicit gate capacitor 216 may not be included in the DCM 200. For instance, the Miller-enhanced capacitance of the feedback capacitor 222 may be large enough to obviate the need for the gate capacitor 216.

As shown in FIG. 2B, during the first operational stage 252, the first switch 204 and the second switch 214 are closed, and the third switch 208 is opened. An input current (e.g., $I_{in}$) is provided to the current memory cell 210, via the input line 202 and the closed first switch 204. During the first operational stage 252, the input current is "measured" and "stored" via the current memory cell 210. More particularly, because the second switch 214 is closed, the total cell capacitance (including the gate capacitor 216 and the feedback capacitor 222) of the current memory cell 210 is charged to a voltage corresponding to the input current. Because the transistor's 212 gate terminal is tied to the transistor's 212 drain terminal during the first operational stage, and the input line 202 is tied to the transistor's 212 drain terminal, the input current is added to the optional offset current 218 and flows into the transistor's 212 drain terminal and out transistor's 212 source terminal.

As shown in FIG. 2B, during the second operational stage 254, the first switch 204 and the second switch 214 are opened, and the third switch 208 is closed. Thus, the transistor's 212 gate terminal is switched from the "outside world" to the "inside world." The voltage stored by the total cell capacitance of the current memory cell 210 is provided to the transistor's 212 gate terminal, and a drain current flows into transistor's 212 drain terminal. The optional offset current 218 is now subtracted from the transistor's 212 drain current. Thus, an output current (e.g., $I_{out}$) flows from the output line 206 to ground. The output current of the second operational stage 254 "matches" or "mirrors" the input current of the first operational stage 252.

In some embodiments of DCM 200, additional optional stages may be inserted between the first and second operational stages to avoid toggling two or more switches simultaneously. As shown in FIG. 2B, an optional additional first idle stage 256 is inserted between the first operational stage 252 and the second operational stage 254. The first idle stage 256 helps to guard against the first switch 204 and the third switch 208 being closed simultaneously, which is undesirable as it would connect the input line 202 to the output line 206, shorting the output to the input. Similarly, an optional additional second idle stage 258 is inserted between the second operational stage 254 and the following first operational stage 252, to help guard against the first switch 204 and the third switch 208 being closed simultaneously. An optional additional settling stage 260 is also shown inserted immediately after the first operational stage 252. The optional additional settling stage 260 is used to avoid the first switch 204 opening before the second switch 214. If the first switch 204 opens before the second switch 214, then the current flowing into the current memory cell 210 from the input line would cease, which could cause the gate capacitor 216 to discharge, resulting in the wrong current being stored.

In some embodiments, the input voltage range of the inverting amplifier 220 may be tuned to match the expected range of the transistor's 212 gate terminal voltage. The inverting amplifier's 220 output range may be tuned to absorb the expected disturbances (e.g., leakage, charge injection, and capacitive coupling). However, in some applications of DCM 200, the transistor's 212 gate voltage may exceed the input voltage range of the inverting amplifier 220. If reducing the inverting amplifier's 220 gain to increase its input range is not feasible, then a dynamic amplifier may be used in some embodiments.

Figure 3A:
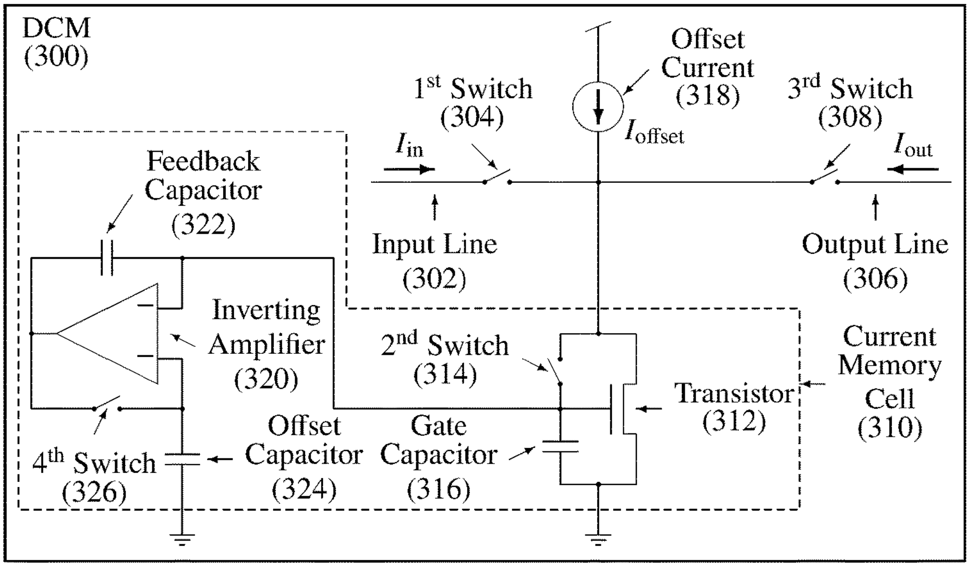
FIG. 3A shows still another embodiment of a dynamic current mirror that employs a dynamic inverting amplifier.
Figure 3B:
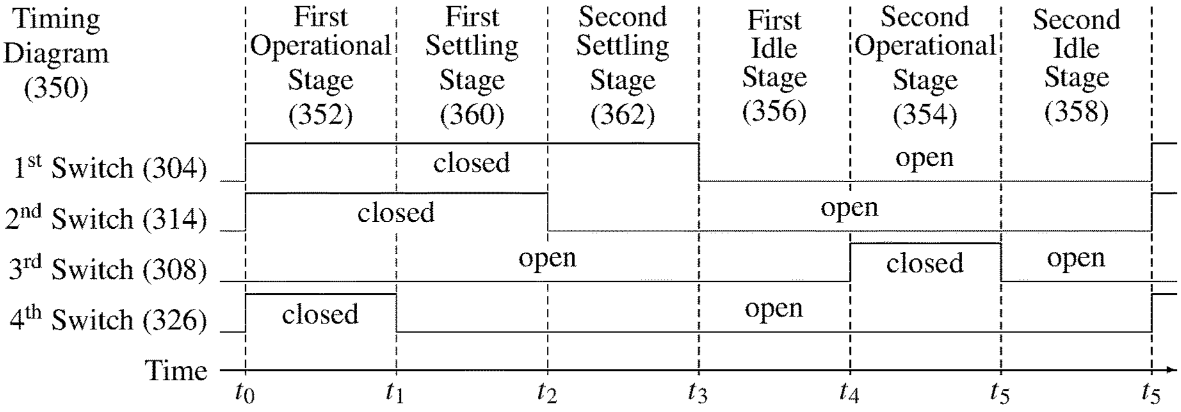
FIG. 3B shows a timing diagram for the operational stages of the dynamic current mirror of FIG. 3A.

Referring now to FIGS. 3A-3B, FIG. 3A show another embodiment of a dynamic current mirror (DCM) 300, and FIG. 3B shows the timing diagram 350 of the operational stages of DCM 300 of FIG. 3A. The DCM 300 of FIG. 3A employs a dual-input inverting amplifier 220, arranged in a Miller amplifier configuration with feedback capacitor 322, and with an offset adjustment capacitor 324. The use of the offset adjustment capacitor 324 allows the inverting amplifier 320 to adapt the input voltage range of inverting amplifier 320 to the voltage range of transistor's 312 gate terminal. This allows a wider range of input currents on the input line. Thus, embodiments similar to DCM 300 may be referred to as dynamic Miller-effect DCMs. Similar to DCM 200 of FIG. 2A, DCM 300 has an input line 302, an optional offset current 318, and an output line 306. Also similar to DCM 200, DCM 300 has a current memory cell 310. The input line 302 of DCM 300 is tied to the current memory cell 310 through a first switch 304. The output line 306 is tied to the current memory cell 310 through a third switch 308. The optional offset current 318 provides an offset current (e.g., $I_{offset}$) to the current memory cell 310 to shift the gate voltage of the current memory cell 310 if needed. Similar to current memory cell 210 of FIG. 2A, the current memory cell 310 includes a transistor 312, a second switch 314, and a gate capacitor 316. Similar to current memory cell 210 of FIG. 2A, DCM 300 also contains an inverting amplifier 320 and a feedback capacitor 322. In contrast to current memory cell 210, inverting amplifier 320 has a second inverting input, an offset capacitor 324, and a fourth switch 326. The first terminal of the offset capacitor 324 is connected to the second inverting input of inverting amplifier 320, and the second terminal of capacitor 324 is connected to ground or another fixed voltage. The second inverting input of inverting amplifier 320 is also tied to the output terminal of inverting amplifier 320 through the fourth switch 326. Other methods of adapting the input range of inverting amplifier 320 are possible and would feature other arrangements of switches and/or capacitors to accomplish the task.

As shown in FIG. 3B, during the first operational stage 352, the first switch 304, the second switch 314, and the fourth switch 326 are closed. During the first operational stage 352, the third switch 308 is open. An input current (e.g., $I_{in}$) is provided to the current memory cell 310, via the input line 302 and the closed first switch 304. During the first operational stage 352, the input current is "measured" and "stored" via the current memory cell 310. Because the transistor's 312 gate terminal is tied to the transistor's 312 drain terminal during the first operational stage, the input current is added to the optional offset current 318 and flows into the transistor's 312 drain terminal and out transistor's 312 source terminal. Furthermore, because the fourth switch 326 is closed, the inverting amplifier 320 adapts its input range to the transistor's 312 gate terminal voltage.

As shown in FIG. 3B, during the second operational stage 354, the first switch 304, the second switch 314, and the fourth switch 326 are opened. During the second operational stage, the third switch 308 is closed. Thus, the transistor's 312 gate terminal is switched from the "outside world" to the "inside world." The voltage stored by the total cell capacitance of the current memory cell 310 is provided to the transistor's 312 gate terminal, and a drain current flows into transistor's 312 drain terminal. The optional offset current 318 is now subtracted from the transistor's 312 drain current. Thus an output current (e.g., $I_{out}$) flows from the output line 306 to ground. The output current of the second operational stage 354 "matches" or "mirrors" the input current of the first operational stage 352.

In some embodiments of DCM 300, additional optional stages may be inserted between the first and second operational stages to avoid toggling two or more switches simultaneously. As shown in FIG. 3B, an optional additional first idle stage 356 is inserted between the first operational stage 352 and the second operational stage 354. The first idle stage 356 helps to guard against the first switch 304 and the third switch 308 being closed simultaneously, which is undesirable as it would connect the input line 302 to the output line 306, shorting the output to the input. Similarly, an optional additional second idle stage 358 is inserted between the second operational stage 354 and the following first operational stage 352, to help guard against the first switch 304 and the third switch 308 being closed simultaneously. An optional additional first settling stage 360 is also shown inserted immediately after the first operational stage 352. The optional additional first settling stage 360 is used to avoid the second switch 314 opening before the fourth switch. An optional additional second settling stage 362 is also shown inserted immediately after the optional additional first settling stage 360 and before the optional first idle stage 356. The optional additional second settling stage 362 is used to avoid the first switch 304 opening before the second switch 314. If the first switch 304 opens before the second switch 314, then the current flowing into the current memory cell 310 from the input line would cease, which could cause the gate capacitor 316 to discharge, resulting in the wrong current being stored.

It will also be apparent to those skilled in the art that the switches shown in the FIGS. 1A, 2A, and 3A may be employed for the functional operation of the DCMs according to their timing diagrams, and that numerous optimizations or improvements are possible. For example, the second switches which are connected between the gate terminal and the drain terminal of the transistor could instead be connected between the gate terminal of the transistor and the input line. Additional switches could be added to control additional aspects of the circuit.

It will also be apparent to those skilled in the art that various buffers and amplifiers (both current and voltage) may be added to the DCMs to improve performance. For example, the drain terminal and gate terminal of the transistor may be connected via an amplifier and a switch instead of only a switch. For another example, the transistor may have a cascode transistor at its drain terminal to buffer the drain current.

It will also be apparent to those skilled in the art that whereas the transistors in a conventional current mirror need not be the same size (e.g., if a multiplicative constant in the output current relation to the input current is desired), the same effect can be achieved in the DCMs via additional switches and/or transistors.

It will also be apparent to those skilled in the art that whereas a conventional current mirror can have multiple outputs, the same effect can be achieved in the DCMs via additional switches and/or transistors.

It will also be apparent to those skilled in the art that whereas a conventional current mirror produces an output current continuously, a DCM normally only produces an output current during the second operational stage. However, multiple DCMs can be operated together with their timing delayed from one to the next such that there is always one DCM producing an output current. Thus the task of producing the output current is relayed between two or more DCM (e.g. ping-pong operation) to provide a continuous output current.

Figure 4:
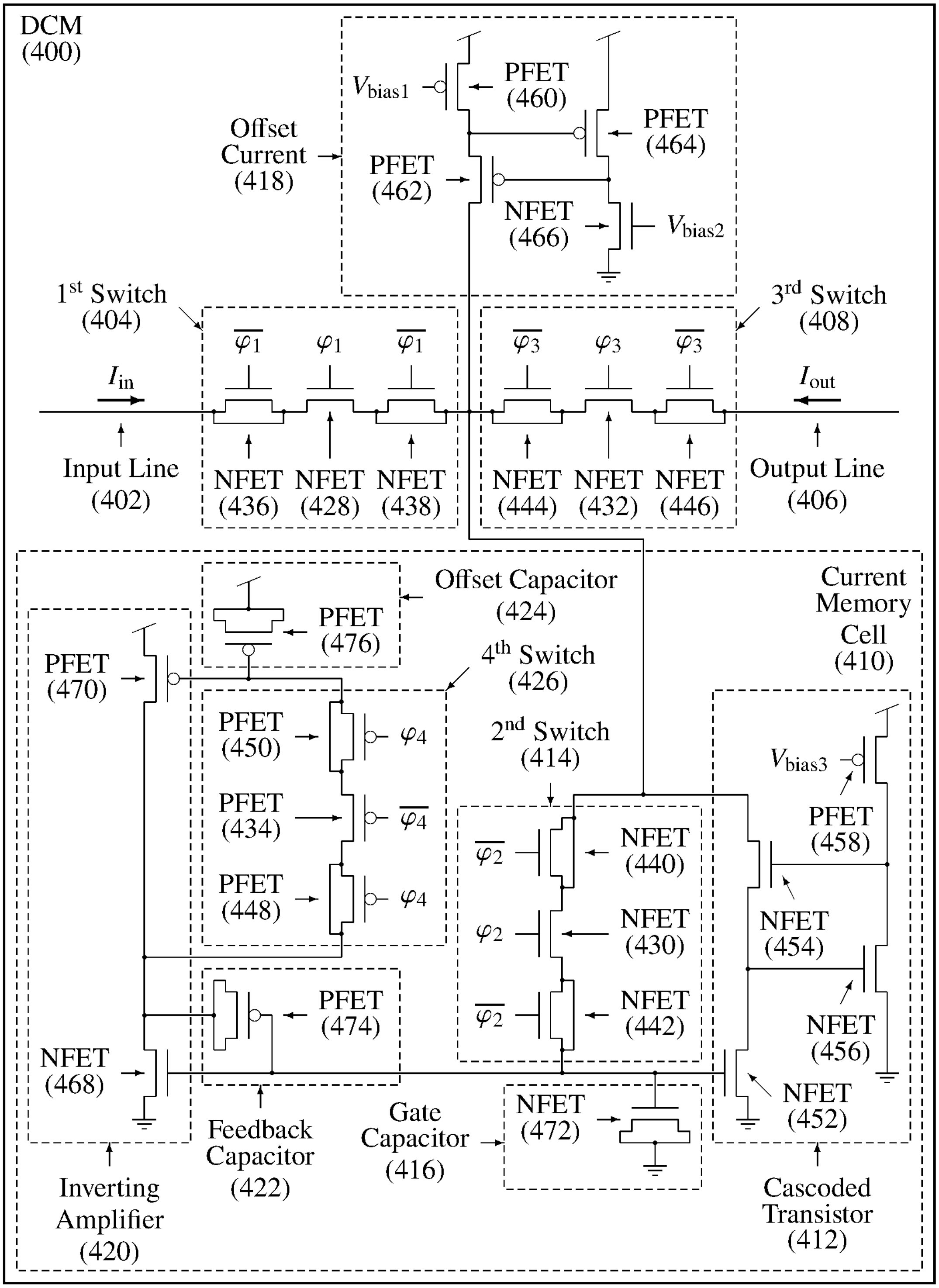
FIG. 4 shows yet another embodiment of a dynamic current mirror that employs a dynamic inverting amplifier, according to various embodiments.

FIG. 4 shows an example embodiment DCM 400 of DCM 300 of FIG. 3A using field effect transistors (FETs) for all the components of DCM 300. Some FETs are N-type (e.g. N-MOS FET) and some are P-type (e.g. P-MOS FET) according to how they are used in the circuit. Similar to DCM 300, DCM 400 has an input line 402, a first input switch 404, an output line 406, a third switch 408, a current memory cell 410, a second switch 414, an optional gate capacitor 416, an optional offset current 418, an inverting amplifier 420, a feedback capacitor 422, and an offset capacitor 424. In contrast to transistor 312 of FIG. 3A, DCM 400 uses a cascoded transistor circuit 412. FIG. 4 also shows the four switch control signals $\varphi_1$, $\varphi_2$, $\varphi_3$, and $\varphi_4$, as well as the complements of these switch control signals.

More particularly, switches 404, 408, 414, and 426 in DCM 400 are composed of main transistors 428-434 and optional dummy transistors 436-450. The dummy transistors are sized to reduce or cancel the charge injected when the main transistors are turned off. Dummy transistors are shown on both sides of the main transistors, although the ones connected to capacitors (transistors 442 and 450) are more important than the others. The switches can also be implemented using complementary devices (e.g. both N-type and P-type in parallel). The switches may also use reduced signal swing for the control signals to further reduce charge injection. Other common methods for charge injection reduction may also be used.

More particularly, DCM 400 includes cascoded transistor sub-circuit 412. Sub-circuit 412 uses transistor 452 which is cascoded by transistor 454 to improve the memory cell's 410 output conductance. Cascoding transistor 454 is not required for DCM 400 to function, but improves the matching of the output current $I_{out}$ to the input current $I_{in}$ when the voltage on the output line 406 is different from the voltage on the input line 402. Transistor 454 is controlled by an inverting amplifier composed of transistors 456 and 458, to create a regulated cascode circuit structure. This configuration further improves the memory cell's 410 output conductance over controlling transistor 454 with a constant voltage. A similar regulated cascode structure is used for optional offset current 418. Transistor 460 sets the offset current $I_{offset}$ and transistor 462 cascodes transistor 460. Transistors 464 and 466 form the inverting amplifier to control transistor 462.

More particularly, DCM 400 includes inverting amplifier 420, which has two inverting inputs. Inverting amplifier 420 is composed of transistors 468 and 470. Similarly to inverting amplifier 320 of FIG. 3A, inverting amplifier 420 has two inverting inputs, which are the gate terminals of transistors 468 and 470. The inverting input of transistor 468 is connected to the gate terminal of transistor 452, and is the input that provides the Miller amplification of the feedback capacitance. The inverting input of transistor 470 is used to adapt the input range of inverting amplifier 420 to the range of voltage at the gate terminal of transistor 454.

More particularly, FIG. 4 also shows the three optional capacitors (gate capacitor 416, feedback capacitor 422, and offset capacitor 424) each implemented using a field effect transistor. Gate capacitor 416 is composed of transistor 472. The gate terminal of transistor 472 is connected to the gate terminal of transistor 452. The source and drain terminals of transistor 472 are connected to ground or some other fixed voltage. Transistor 452 already has a parasitic gate capacitance, so gate capacitor 416 is used to augment the parasitic gate capacitance if desired. Feedback capacitor 422 is composed of transistor 474. The gate terminal of transistor 474 is connected to the inverting input of inverting amplifier 420 at the gate terminal of transistor 468. The source and drain terminals of transistor 474 are connected to the output of inverting amplifier 420. Inverting amplifier 420 already has a parasitic feedback capacitance, so feedback capacitor 422 is used to augment the parasitic feedback capacitance if desired. Offset capacitor 424 is composed of transistor 476. The gate terminal of transistor 476 is connected to the inverting input of inverting amplifier 420 at the gate terminal of transistor 470. The source and drain terminals of transistor 474 are connected to the power supply or other fixed voltage source. Inverting amplifier 420 already has an input capacitance at the gate terminal of transistor 470, so offset capacitor 422 is used to augment the parasitic input capacitance if desired. Other capacitor types may be used without deviating from the scope of the present disclosure. For instance, the capacitors can be implemented as either P-type or N-type field effect transistors. For instance, the capacitors can also be implemented as other capacitor types when available in the circuit's fabrication technology (e.g. Metal-Insulator-Metal (MiM) capacitors or double-poly capacitors).

Additional Embodiments

According to some aspects of the present disclosure, an electrical circuit is operated in a first operational stage and a second operational stage that is temporally subsequent to the first stage. During the first operational stage, the circuit is configured to transmit an input signal into a first element. The input signal includes an input current. During the second operational stage, the circuit is configured to drive a transmission of an output signal out of the first element. The output signal includes an output current. The circuit comprises an inverting amplifier. The inverting amplifier is configured to invert and amplify an input voltage associated with the input signal such that a capacitance of a capacitive element of the circuit is increased via a Miller-effect amplification. The Miller-effect amplification is enabled by the capacitive element capacitively coupling an output terminal and an input terminal of the inverting amplifier. During the first operational stage, the cell capacitance is configured to store the input voltage. The cell capacitance is increased via the Miller-effect amplification of the capacitance of the capacitive element. During the second stage, the cell capacitance is configured to provide the stored input voltage to drive the transmission of the output signal such that the output current matches the input current.

The circuit may further comprise a memory cell, an input line, and an output line. The memory cell may include the inverting amplifier and the cell capacitance. During the first operational stage, the input line is configured to transmit the input signal into the first element. During the second operational stage, the output line is configured to transmit the output signal from the first element.

During the first operational stage, the input line may be configured to transmit the input signal into the first element via a first switch that is closed during the first operational stage and opened during the second operational stage. During the second operational stage, the output line may be configured to transmit the output signal from the second element via a third switch that is opened during the first operational stage and closed during the second operational stage.

The memory cell may further include a transistor with a drain terminal, a source terminal, and a gate terminal. The drain terminal is electrically coupled to input line via the first switch and the output line via the third switch. The source terminal is electrically coupled to the ground source or another fixed voltage source. The gate terminal is electrically coupled to the cell capacitance. The second switch may be closed during the first operational stage and opened during the second operational stage. When closed, the second switch electrically couples the gate terminal of the transistor and the drain terminal of the transistor. When opened, the second switch electrically decouples the gate terminal of the transistor and the drain terminal of the transistor. The transistor may be a field effect transistor (FET).

The inverting amplifier may be a dynamic voltage amplifier that has a dynamic range of input voltages. During the first operational stage, the dynamic range of input voltages of the dynamic amplifier adapts to a voltage of the gate terminal of the transistor. During the second operational stage, the dynamic amplifier inverts and amplifies the input voltage.

In some embodiments, the memory cell further includes a gate capacitor that has a first terminal electrically coupled to the gate terminal of the transistor and a second terminal that is electrically coupled to the ground source or another fixed voltage source. The gate capacitor may contribute to the cell capacitance.

The inverting amplifier may be a voltage amplifier with a negative gain. The circuit may be included in a dynamic current mirror (DCM) such that a flow direction of the output current matches a flow direction of the input current. The DCM may be included in an analog finite impulse response (FIR) filter. In such embodiments, the output signal is employed to accumulate and store events for filtering. The analog filter may be employed for filtering currents associated with an imaging sensor. The events may include currents generated by one or more pixels of the imaging sensor.

The circuit may be fabricated on a complementary metal-oxide semiconductor (CMOS) process. The capacitive element may include a feedback capacitance of the inverting amplifier. The capacitive element may include a capacitor with a first capacitor terminal that is electrically coupled to an output terminal of the inverting amplifier and a second capacitor terminal that is electrically coupled to an input terminal of the inverting amplifier.

According to some other aspects of the present disclosure, an electrical circuit is operated in a first operational stage and a second operational stage that is temporally subsequent to the first stage. The circuit includes an input-signal line, an output-signal line, and a current memory cell. The current memory cell comprises an inverting amplifier. During the first operational stage, the input-signal line is configured to transmit an input signal that has an input current. During the second operational stage, the output-signal line is configured to transmit an output signal that has an output current. During the first operational stage, the current memory cell is configured to transmit the input signal between the input-signal line and a fixed-voltage source (e.g., a ground source or another constant voltage source). Additionally, during the first operational stage, a cell capacitance of the current memory cell is charged to store an input voltage associated with the input signal. During the second operational stage, the current memory cell is configured to employ the input voltage stored by the cell capacitance to drive a transmission of the output signal between the output-signal line and the fixed-voltage source such that the output current matches the input current. The inverting amplifier is configured to increase the cell capacitance via a Miller-effect amplification that includes inverting and amplifying the input voltage. The circuit may be a dynamic current mirror (DCM)

According to still other aspects of the present disclosure, a dynamic current mirror (DCM) is operated in a first operational stage and a second operational stage that is temporally subsequent to the first operational stage. The DCM includes a current memory cell and an inverting voltage amplifier. During the first operational stage, the current memory cell receives an input current and stores a corresponding voltage via a capacitance of the current memory cell. During the second operational stage, the current memory cell employs the stored input voltage to drive an output current that matches the input current. The inverting voltage amplifier is employed to increase the capacitance of the current memory cell via a Miller-effect amplification of the capacitance. The DCM may be included in an analog filter.

This written description uses examples to disclose the technology, including the best mode, and also to enable any person skilled in the art to practice the technology, including making and using any devices or systems and performing any incorporated methods. The patentable scope of the technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal language of the claims.

What is claimed is:

1. An electrical circuit that is operated in a first stage and a second stage temporally subsequent to the first stage, wherein during the first stage, the circuit is configured to transmit an input signal into a first element, the input signal including an input current;

during the second stage, the circuit is configured to drive a transmission of an output signal out of the first element, the output signal including an output current, the circuit comprising:

a cell capacitance that includes a capacitive element; and an inverting amplifier that is configured to invert and amplify an input voltage associated with the input current such that a capacitance of a capacitive element is increased via a Miller-effect amplification enabled by the capacitive element capacitively coupling an output terminal and an input terminal of the inverting amplifier, and wherein during the first stage, the cell capacitance is configured to store the input voltage and is increased via the Miller-effect amplification of the capacitance of the capacitive element; and during the second stage, the cell capacitance is configured to provide the stored input voltage to drive the transmission of the output signal such that the output current matches the input current.

2. The circuit of claim 1, further comprising:

a memory cell that includes the inverting amplifier and the cell capacitance;

an input line that during the first stage, is configured to transmit the input signal into the first element; and an output line that during the second stage, is configured to transmit the output signal out of the first element.

3. The circuit of claim 2, wherein the input line is configured to transmit the input signal during the first stage via a first switch that is closed during the first stage and opened during the second stage; and the output line is configured to transmit the output signal during the second stage via a third switch that is opened during the first stage and closed during the second stage.

4. The circuit of claim 2, wherein the memory cell further includes:

a transistor with a drain terminal that is electrically coupled to the input line via a first switch and the output line via a third switch, a source terminal that is electrically coupled to the ground source or another fixed voltage source, and a gate terminal that is electrically coupled to cell capacitance.

5. The circuit of claim 4, wherein the memory cell further includes:

a second switch that is closed during the first stage and opened during the second stage, and when closed, the second switch electrically couples the gate terminal of the transistor and the drain terminal of the transistor, and when opened, the second switch electrically decouples the gate terminal of the transistor and the drain terminal of the transistor.

6. The circuit of claim 4, wherein the transistor is a field effect transistor (FET).

7. The circuit of claim 4, where the inverting amplifier is a dynamic voltage amplifier that has a dynamic range of input, and wherein during the first stage, the dynamic range of input voltages of the inverting amplifier adapts to a voltage of the gate terminal of the transistor; and during the second stage, the inverting amplifier inverts and amplifies the input voltage.

8. The circuit of claim 4, wherein the memory cell further includes a gate capacitor that has a first terminal electrically coupled to the gate terminal of the transistor and a second terminal that is electrically coupled to the ground source or another fixed voltage source.

9. The circuit of claim 8, wherein the gate capacitor contributes to the cell capacitance.

10. The circuit of claim 1, wherein the inverting amplifier is a voltage amplifier with a negative gain.

11. The circuit of claim 1, wherein the circuit is included in a dynamic current mirror (DCM) such that a flow direction of the output current matches a flow direction of the input current.

12. The circuit of claim 11, wherein the DCM is included in an analog filter and the output signal is employed to accumulate and store events for filtering.

13. The circuit of claim 12, wherein the analog filter is employed for filtering currents associated with an imaging sensor and the events include currents generated by one or more pixels of the imaging sensor.

14. The circuit of claim 1, wherein the circuit is fabricated on a complementary metal-oxide semiconductor (CMOS) process.

15. The circuit of claim 1, wherein the capacitive element includes a feedback capacitance of the inverting amplifier.

16. The circuit of claim 1, wherein the capacitive element includes a capacitor with a first capacitor terminal that is electrically coupled to an output terminal of the inverting amplifier and a second capacitor terminal that is electrically coupled to an input terminal of the inverting amplifier.

17. An electrical circuit that is operated in a first stage and a second stage that is temporally subsequent to the first stage, the circuit comprising:

an input-signal line configured to, during the first stage, transmit an input signal that has an input current;

an output-signal line configured to, during the second stage, transmit an output signal that has an output current; and a current memory cell that, during the first stage, is configured to transmit the input signal between the input-signal line and a fixed-voltage source and a cell capacitance of the current memory cell is charged to store an input voltage associated with the input signal, and during the second stage, is configured to employ the input voltage stored by the cell capacitance to drive a transmission of the output signal between the output-signal line and the fixed-voltage source such that the output current matches the input current, wherein the current memory cell comprises:

an inverting amplifier that is configured to increase the cell capacitance via a Miller-effect amplification that includes inverting and amplifying the input voltage.

18. The circuit of claim 17, wherein the circuit is a dynamic current mirror (DCM).

* * * * *